United States Patent
Todsen et al.

(10) Patent No.: US 6,509,852 B1
(45) Date of Patent: Jan. 21, 2003

(54) APPARATUS AND METHOD FOR GAIN CALIBRATION TECHNIQUE FOR ANALOG-TO-DIGITAL CONVERTER

(75) Inventors: James L. Todsen, Tucson, AZ (US); Binan Wang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/045,240

(22) Filed: Oct. 19, 2001

Related U.S. Application Data (60) Provisional application No. 60/309,890, filed on Aug. 3, 2001.

(51) Int. Cl.[7] .................................................. H03M 2/10
(52) U.S. Cl. ..................... 341/120; 341/118; 341/143; 341/150; 341/155; 341/172
(58) Field of Search ................................ 341/118, 120, 341/143, 150, 155, 172

(56) References Cited

U.S. PATENT DOCUMENTS

| | | | |
|---|---|---|---|
| 4,399,426 A | 8/1983 | Tan | |
| 4,851,841 A * | 7/1989 | Sooch | 341/143 |
| 4,943,807 A | 7/1990 | Early et al. | |
| 5,027,116 A * | 6/1991 | Armstrong et al. | 330/9 |
| 5,061,925 A | 10/1991 | Sooch et al. | |
| 5,087,914 A | 2/1992 | Sooch et al. | |
| 5,134,401 A * | 7/1992 | McCartney et al. | 333/173 |
| 5,159,341 A * | 10/1992 | McCartney et al. | 341/122 |
| 5,172,115 A | 12/1992 | Kerth et al. | |
| 5,196,850 A | 3/1993 | Duffy et al. | |
| 5,248,970 A | 9/1993 | Sooch et al. | |
| 5,257,026 A | 10/1993 | Thompson et al. | |
| 5,319,370 A | 6/1994 | Signore et al. | |
| 5,363,102 A * | 11/1994 | Ferguson, Jr. | 341/143 |
| 5,397,944 A | 3/1995 | DuPuis | |
| 5,510,789 A | 4/1996 | Lee | |
| 5,583,501 A | 12/1996 | Henrion et al. | |
| 5,590,065 A | 12/1996 | Lin | |
| 5,594,612 A | 1/1997 | Henrion | |
| 5,644,308 A | 7/1997 | Kerth et al. | |
| 5,691,720 A * | 11/1997 | Wang et al. | 341/118 |
| 5,703,589 A | 12/1997 | Kalthoff et al. | 341/172 |
| 5,745,060 A * | 4/1998 | McCartney et al. | 341/120 |
| 5,757,299 A | 5/1998 | Noro et al. | 341/143 |
| 5,838,598 A * | 11/1998 | Hurrell | 341/120 |
| 5,852,415 A | 12/1998 | Cotter et al. | 341/120 |
| 6,037,887 A * | 3/2000 | Wu et al. | 341/139 |
| 6,040,793 A * | 3/2000 | Ferguson et al. | 327/337 |
| 6,204,787 B1 * | 3/2001 | Baird | 341/139 |

* cited by examiner

*Primary Examiner*—Michael Tokar
*Assistant Examiner*—Khai Nguyen
(74) *Attorney, Agent, or Firm*—W. Daniel Swayze, Jr.; W. James Brady; Frederick J. Telecky, Jr.

(57) ABSTRACT

A method and apparatus for performing gain calibration of an analog to digital converter is provided. During a calibration mode, an input sampling circuit comprised of multiple branches can be configured to provide a calibration mode gain of one. The analog-to-digital converter selects one of the parallel capacitor input sampling branches and repetitively samples the whole charge associated with the calibration voltage signal. This sampling step is repeated for each input sampling branch that is used during normal operation mode. The results of the sampling of the branches may be suitably averaged to create a gain calibration coefficient that is representative of and accounts for sampling variations between the input branches.

27 Claims, 6 Drawing Sheets

APPARATUS AND METHOD FOR GAIN CALIBRATION TECHNIQUE FOR ANALOG-TO-DIGITAL CONVERTER

CROSS-REFERENCE TO RELATED APPLICATION

This application claims priority from U.S. Provisional Application Serial No. 60/309,890, filed on Aug. 3, 2001, and hereby incorporated by reference herein.

TECHNICAL FIELD

The present invention relates, generally, to analog to digital converters. More particularly, the present invention relates to an improved apparatus and method for gain calibration of over-sampled analog to digital converters.

BACKGROUND OF THE INVENTION

A popular technique for implementing analog-to-digital converters includes the use of delta-sigma modulation wherein an analog voltage is input to a delta-sigma modulator. Such modulators produce noise, e.g., quantization and thermal noise, which is usually then reduced by a subsequent digital filter. The digital filter generally uses decimation in the filtering process, with the result that the digital data is output at a much slower rate than the output rate of the modulator, e.g., by converting from the sampling rate of the signal to a lower rate. This filtering process is generally operable to remove large amounts of noise at the cost of reducing the bandwidth of the analog-to-digital converter. Taking more than one sample per digital filter data output allows the analog-to-digital converter to average the samples, and thus improving accuracy at the expense of speed.

It is sometimes desirable to include amplification capabilities in an analog-to-digital converter, such as in a programmable gain amplifier. Without amplification, i.e., at unity gain, the full scale input signal typically equals the reference signal. With amplification, e.g., with a gain greater than one, the full scale input signal is a fraction of the reference signal. By scaling the voltage received at the input by increasing the gain, higher precision can be obtained.

The gain can be increased in various manners, for example as set forth more fully in U.S. Pat. No. 6,037,887, issued on Mar. 14, 2000 and assigned to the assignee of this application. In addition, the various manners for increasing the gain can include the increasing of the size of the input capacitor of the input sampling circuit, e.g., adding additional capacitors in parallel to the existing input capacitor, and/or multi-sampling which allows the gain to be adjusted by varying the rate of transfer of charge from the input capacitor relative to the rate of the modulator. Although there are advantages to analog-to-digital converters having gain capabilities, as discussed below, gain error can also be introduced.

In an ideal analog-to-digital converter, for every level of analog signal, there would be the intended corresponding digital signal. However, in reality, system imperfections degrade the accuracy of the digital representation of the analog signal resulting in errors, including offset error and gain error. Offset error exists when a zero voltage input signal generates a non-zero digital signal. Gain error exists when a non-zero analog input voltage creates a digital word which is greater or less than the intended result. The process of adjusting the digital output to correct for these errors is called calibration.

Calibration techniques generally involve the process of determining the amount of offset error and storing a compensating value in an offset calibration coefficient, and determining the amount of gain error and storing a compensating value in a gain calibration coefficient. Afterwards, these coefficients are used to adjust output to correct for the offset and gain errors. Several methods for determining offset and gain calibration coefficients have been developed.

For example, an analog-to-digital converter may be calibrated at unity gain even though the device operates with a gain greater than one during a non-calibration mode. Furthermore, in unity gain sampling applications involving a single input capacitor, generally the whole charge associated with the calibration voltage is sampled onto the input capacitor. However, there also exists prior art gain calibration techniques that divide up an input capacitor into smaller parallel capacitors, sample a partial or fractional portion of the charge associated with the calibration voltage, and do not sample at a gain of one.

For example, U.S. Pat. No. 5,745,060, issued Apr. 28, 1998 to McCartney et al., as illustrated with reference to FIG. 1, discloses a technique and circuit that divides the total capacitance of the input sampling section into fractional portions of the total capacitance, e.g., divides the input capacitor from a capacitance value of C to four capacitors having a capacitance value of C/4, Next, this circuit samples through all of the capacitor portions at the modulator clock rate taking one sample with each capacitor portion, wherein each sample represents a fractional portion of the sampled calibration voltage, i.e., the technique samples a portion of the full scale charge. As a result, the calibration technique of McCartney intersperses all the samples from all the capacitor portions and creates one amalgamation of analog samples (prior to the digital filter) that is converted into a single digital word representing the calibration voltage.

Figure 1:
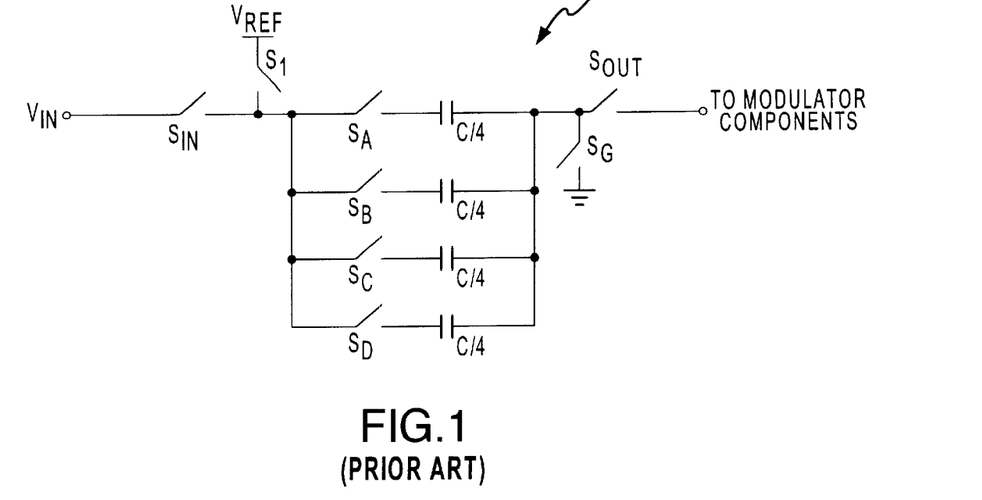
FIG. 1 illustrates a schematic diagram illustrating a prior art input sampling circuit divided into multiple capacitor portions.

However, the McCartney technique requires a clocking signal to rotate through the input capacitors. This clocking signal can possibly interfere with the other clocks signals and create unwanted low-frequency tones that appear in the output. Also, the noise of the calibration result will be approximately the same as the normal mode results since only one conversion is used to calculate the calibration coefficients.

Therefore, a need exists for a method and apparatus that performs gain calibration in a cleaner, less complex configuration, and with capabilities to reduce the noise and increase the accuracy of the analog-to-digital converter.

SUMMARY OF THE INVENTION

The present invention addresses many of the shortcomings of the prior art. In accordance with various aspects of the present invention, a method and apparatus for performing gain calibration of an analog to digital converter is provided. In accordance with an exemplary embodiment, during a calibration mode, an input sampling circuit comprised of multiple branches can be configured to provide a calibration mode gain of one. The analog-to-digital converter selects one of the parallel capacitor input sampling branches and repetitively samples the whole charge associated with the calibration voltage signal. This sampling step is repeated for each input sampling branch that is used during normal operation mode. The results of the sampling of the branches may be suitably averaged to create a gain calibration coefficient that is representative of and accounts for sampling variations between the input branches.

Moreover, the analog-to-digital converter calibration can be performed regardless of whether the normal mode gain is equal to or higher than one.

The averaging of the sampled input branches can be conducted in various manners. In accordance with an exemplary embodiment, the samples of data from each capacitor branch are fully processed by the digital filter prior to averaging the results. In accordance with another exemplary embodiment, the separate data from the capacitor branches are merged in the digital filter, thus decreasing the time it takes to calibrate the analog-to-digital converter. In this embodiment, averaging occurs without the need to wait for complete settling of the digital filter for each input branch.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE PRESENT INVENTION

The present invention may be described herein in terms of various functional components and various processing steps. It should be appreciated that such functional components and functions may be realized by any number of hardware or structural components configured to perform the specified functions. For example, the present invention may employ various integrated components, e.g., buffers, supply references, current mirrors, signal processors and the like, comprised of various electrical devices, e.g., resistors, transistors, capacitors, diodes and other components whose values may be suitably configured for various intended purposes. In addition, the present invention may be practiced in any integrated circuit application where gain calibration techniques can be utilized. Such general applications that may be appreciated by those skilled in the art in light of the present disclosure are not described in detail herein. However for purposes of illustration only, exemplary embodiments of the present invention will be described herein in connection with an analog-to-digital converter. Further, it should be noted that while various components may be suitably coupled or connected to other components within exemplary circuits, such connections and couplings can be realized by direct connection between components, or by connection or coupling through other components and devices located therebetween.

Although various exemplary embodiments of the present invention can suitably perform the techniques of the present invention, an exemplary analog-to-digital converter will be discussed herein. With reference to an exemplary embodiment illustrated in FIG. 2, an analog to digital converter system 200 receives an analog signal through analog input signal $V_{IN}+$ and $V_{IN}-$ and converts the signal into digital output 240. Analog-to-digital converter 200 includes a modulator 210, a digital filter 220, and error correction logic 230. Modulator 210 is configured to receive analog signal $V_{IN}+$ and $V_{IN}-$ from input 202 during normal mode operation, or a calibration voltage source $V_{REF}$ (not shown) during calibration mode. Selection between analog signal $V_{IN}+$ and $V_{IN}-$ or calibration voltage source $V_{REF}$ is conducted through the appropriate opening and closing of various switches configured within modulator 210.

Figure 2:
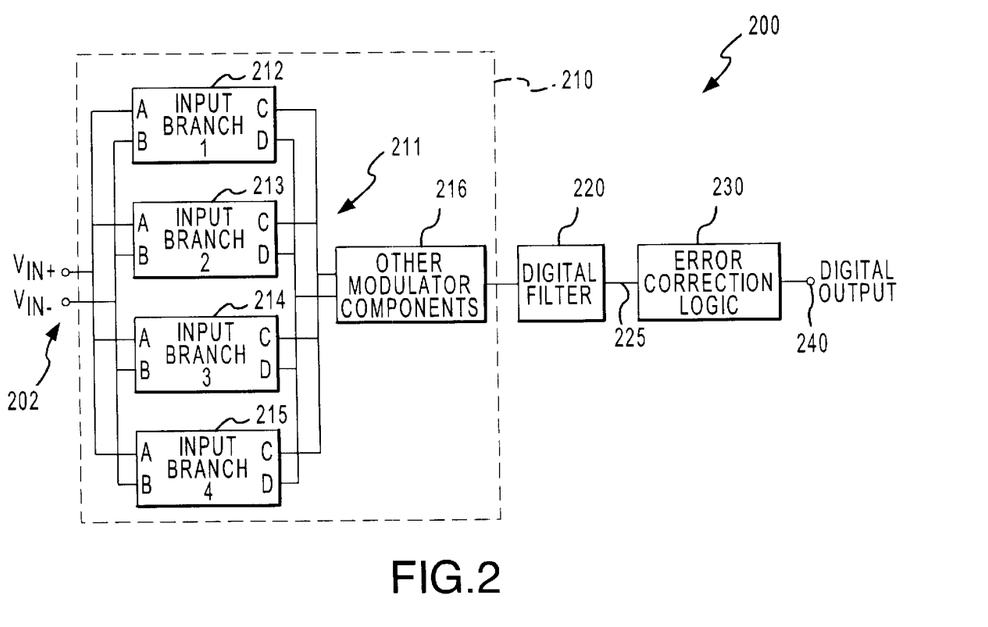
FIG. 2 illustrates a schematic diagram of an exemplary analog-to-digital converter in accordance with an exemplary embodiment of the present invention.

Modulator 210 is also configured to provide a series of samples of analog signal $V_{IN}+$ and $V_{IN}-$ to digital filter 220. Digital filter 220 receives the series of samples and converts those signals into digital signals 225 representing the analog signal $V_{IN}+$ and $V_{IN}-$. These digital signals 225 can be provided to error correction section 230 which can suitably adjust, correct or otherwise modify the digital signals to account for any errors occurring within this analog to digital conversion process.

Modulator 210 is further comprised of an input sampling circuit 211 comprising multiple input sampling branches, e.g., input branches 212–215, other modulator components 216, and a program control unit (not shown). Input sampling branches 212–215 are configured in a parallel arrangement to receive analog signals for modulator 210 as described above and sample those signals onto input capacitor(s). The charge on the input capacitor(s) in input sampling branches 212–215 can then be transferred to other modulator components 216, such as signal processing/feedback components, which provide signals to digital filter 220. The devices within other modulator components 216 for performing signal processing and providing feedback are well known in the art and are not described in detail herein.

Input sampling branches 212–215 and other modulator components 216 are configured with the program control unit which directs the opening and closing of switches within input sampling branches 212–215 to perform the techniques described herein. In accordance with an exemplary embodiment, the program control unit comprises a dedicated hardware device. Alternatively, in accordance with other embodiments, program control unit can also be implemented with software, with the program being stored in devices such as RAM or EPROM.

As discussed above, prior art input sampling circuits are configured with an input capacitor divided up into various capacitor components, and are configured to provide sampling of a partial full scale signal at high gains, which has various disadvantages. However, in accordance with the present invention, an exemplary input sampling circuit 211 comprises a plurality of input branches, e.g., input branches 212 through 215, that are configured to facilitate calibration of each input branch one at a time using the full scale signal. During use of input sampling circuit 211, it should be noted that scaling errors measured in the sampled input branch are assumed to be the same as scaling errors in the other input branches used during normal mode (non-calibration mode), when the gain is greater than one.

In accordance with this exemplary embodiment of the present invention, each of the multiple input branches 212–215 are suitably coupled to the input signal $V_{IN+}$ and $V_{IN-}$ at nodes A and B, and are suitably coupled to other modulator components 216, i.e., the remaining components of the modulator, including, for example, signal processors, integrators, comparators, feedback circuits, at nodes C and D.

Various exemplary embodiments of input sampling branches 212–215 may perform the calibration techniques of the present invention. For example, with additional reference to FIG. 3, an exemplary input sampling branch 212 can include input capacitors $C_{IN1}$ and $C_{IN2}$, and various switches, such as ground switches $S_{GA}$–$S_{GD}$, sampling switches 302A–D, and calibration switches S1 and S2 for facilitating sampling of the analog input signal $V_{IN+}$ and $V_{IN-}$ or calibration signal $V_{REFH}$ and $V_{REFL}$. For example, input signal $V_{IN+}$ and $V_{IN-}$ can be connected via switches 302A and 320B to input capacitors $C_{IN1}$ and $C_{IN2}$, while calibration signal, $V_{REFH}$ and $V_{REFL}$, can be connected via switches S1 and S2 to input capacitors $C_{IN1}$ and $C_{IN2}$.

Figure 3:
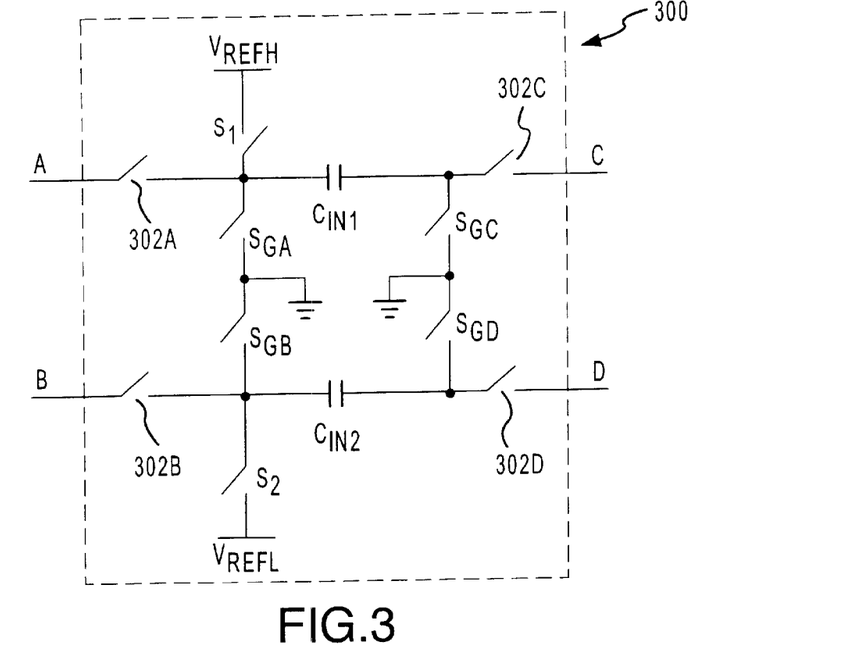
FIG. 3 illustrates an exemplary embodiment of an input sampling section in accordance with the present invention.

With additional reference to FIG. 2, during normal operation mode, for example, a gain of four operation can be achieved by sampling analog input signal $V_{IN+}$ and $V_{IN-}$ on all four input branches 212–215 in parallel. This sampling can be accomplished by closing switches 302A and 302B and ground switches $S_{GC}$ and $S_{GD}$, and opening switches 302C and 302D, ground switches $S_{GA}$ and $S_{GB}$, and calibration switches S1 and S2. With the switches in these positions, a charge representative of analog input signal $V_{IN+}$ and $V_{IN-}$ at 202 can be transferred to input capacitors $C_{IN1}$ and $C_{IN2}$. Next, switches 302A and 302B and ground switches $S_{GC}$ and $S_{GD}$ can be opened, and switches 302C and 302D and ground switches $S_{GA}$ and $S_{GB}$ can be closed. This results in the transfer of the charge from input capacitors $C_{IN1}$ and $C_{IN2}$ to provide the sampled charge to other modulator components 216 through nodes C and D. This process can be repeated multiple times to provide other modulator components 216 with a series of analog temporal representations of the voltage signal.

During calibration mode, gain of one sampling can be achieved on each individual input branch 212–215. Calibration voltage $V_{REFH}$ and $V_{REFL}$ can be connected to the individual input sampling branch by opening switches 302A–D and closing calibration switches S1 and S2 and ground switches $S_{GC}$ and $S_{GD}$. The calibration voltage can then be repetitively sampled on only one input branch at a time, i.e., gain of one calibration mode sampling can be performed by selecting only one of the four input branches 212–215 at a time for sampling. As an example, the full scale calibration voltage can be sampled onto input capacitors $C_{IN1}$ and $C_{IN2}$ when switches 302A–D are opened and calibration switches S1 and S2 and ground switches $S_{GC}$ and $S_{GD}$ are closed. Next, ground switches $S_{GC}$ and $S_{GD}$ and switches S1 and S2 are opened, and ground switches $S_{GA}$ and $S_{GB}$ and switches 302C and 302D are closed, thus allowing the charge on input capacitors $C_{IN1}$ and $C_{IN2}$ to be provided along to other modulator components 216. This process can be repeated multiple times at a first sampling rate, which could be, for example, the modulator clock rate. Sampling on branch 212 can be repeated multiple times while the corresponding switches 302A–D of input branches 213, 214 and 215 remain open, thus removing the other three branches from sampling.

Calibration mode sampling can then repeat the sampling process described above for branches 213, 214 and 215 in order. Alternatively, any order can be selected for sampling the separate input sampling branches. Furthermore, in accordance with other embodiments of the present invention, some input sampling branches may be sampled more than once as described above. In accordance with an exemplary embodiment of the present invention, the program control unit can rotates through the multiple input branches 212–215 at the digital filter clock rate, sampling the full scale signal at each branch before proceeding to the next branch.

It should be noted that while the program control unit can control the timing and coordination of the opening and closing of the various switches necessary to perform the method of the invention, other methods for controlling the opening and closing of switches can be utilized. For example, any device or program with performs the function of repetitively sampling an input signal or calibration signal may be utilized.

Figure 4:
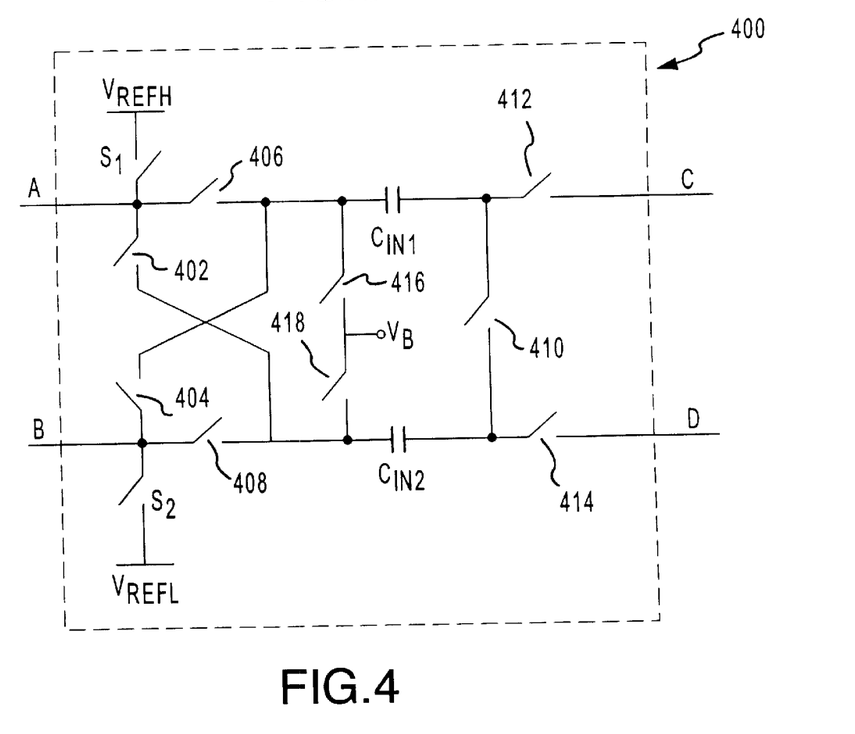
FIG. 4 illustrates another exemplary embodiment of an input sampling section in accordance with the present invention.

Input branch circuitry 211 can also comprise other input branch configurations. For example, with reference to FIG. 4, input branch section can comprise other arrangements of switches 402–418, switches S1 and S2, and input capacitors $C_{IN1}$ and $C_{IN2}$. Such an input branch is more fully disclosed in U.S. Pat. No. 5,703,589, issued Dec. 30, 1997 and assigned to the assignee of this application, the subject matter of which is hereby incorporated herein by reference. Moreover, although any of the exemplary embodiments illustrated in FIGS. 3 and 4 can be used to implement the techniques of the present invention, it should be noted that various other input sampling section configurations could also be used as well.

In addition, it should also be noted that the exemplary embodiment of an input sampling branch 211 having four input branches 212–215 is merely for illustration purposes, and that a less or greater number of input branches may be implemented. For example, as few as two input branches, or as many as 16 or more input branches may be suitably implemented depending upon any number of factors and design criteria.

With reference again to FIG. 2, other modulator components 216 of modulator 210 receives a series of samples from input branch section 211 and provides to digital filter 220 a string of ones and zeros representative of analog signal input 202. As discussed with respect to the prior art, gain calibration is performed by sampling a fractional portion of the calibration voltage on each capacitor of the input branch and rotating from one capacitor to the next for each sample. Therefore, in the prior art, the output of the modulator is an amalgamation of digital samples taken from all the capacitors. In contrast, the exemplary method and system of the present invention samples the whole charge, the complete input signal or calibration voltage, on one input branch before moving to the next input branch. In addition, this sampling of the whole charge can be conducted repetitively on an input branch before moving on to the next input branch, thus creating a block of digital samples representative of whole charge samples taken from one input branch.

Digital filter 220 receives from modulator 210 a stream of digital signals representative of sampled signals (in either calibration mode or normal mode). Digital filter 220 generates a digital filter signal output 225 which is delivered to the input of error correction section 230. Many different digital filters are available in the field of signal processing. In an exemplary embodiment, a sinc$^3$ digital filter is employed; however, other digital filters can also be included within various other exemplary embodiments of the present invention, e.g., different order sinc-type filters can be suitably utilized.

Upon receiving the various sampled signals from each input branch, the analog-to-digital converter 200 can suitably average the signals. As will be described in more detail below, the averaging of the sampled input branches can be conducted in.various manners. In accordance with an exemplary embodiment, the samples of data from each capacitor branch are fully processed by digital filter 220 prior to averaging the results. In accordance with another exemplary embodiment, the separate data from the capacitor branches are merged within digital filter 220, thus decreasing the time it takes to calibrate the analog-to-digital converter. In this exemplary embodiment, averaging occurs without the need to wait for complete settling of the digital filter for each input branch.

Figure 5A:
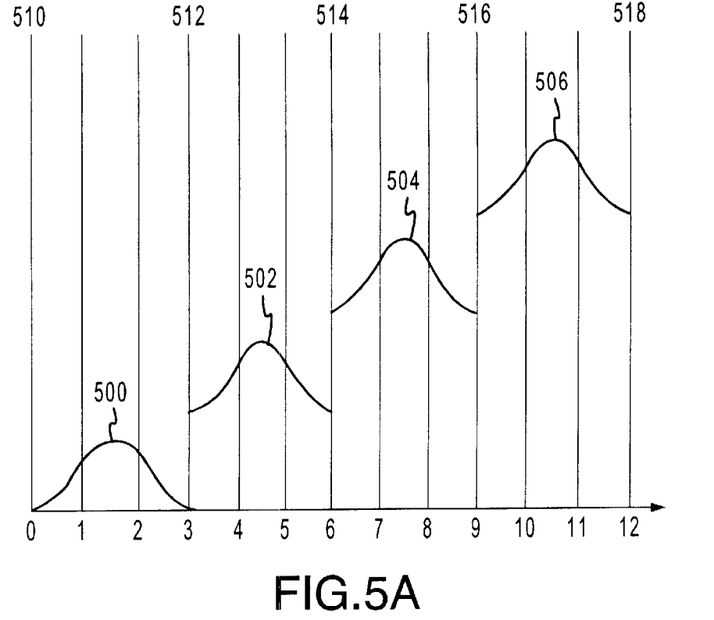
FIG. 5A illustrates a timing diagram of a digital filter output in accordance with an exemplary embodiment of the present invention.
Figure 5B:
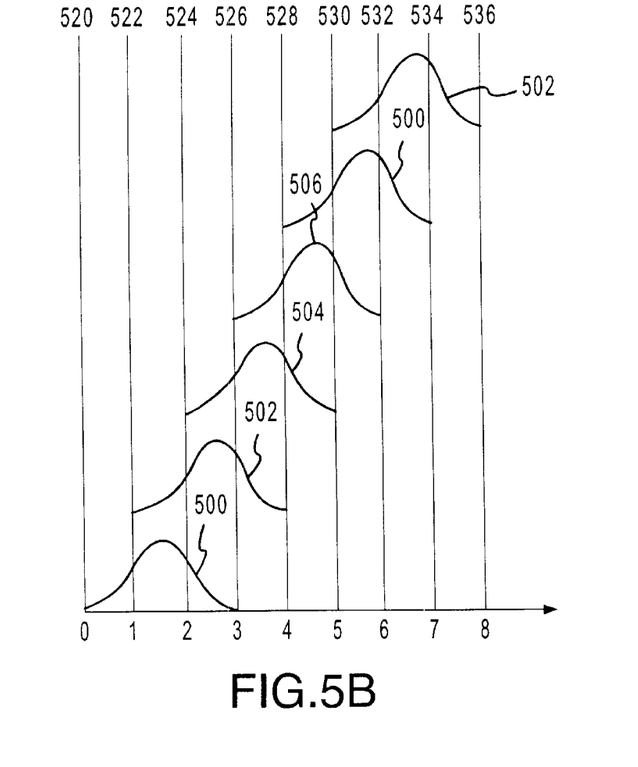
FIG. 5B illustrates a timing diagram of a digital filter output in accordance with another exemplary embodiment of the present invention.

In accordance with an exemplary embodiment, FIGS. 5A and 5B show the impulse response of the exemplary sinc$^3$ digital filter 220. Each time division represents one digital filter clock cycle. In this example, digital filter 220 requires three digital filter cycles to settle. Therefore, although a digital word is created every digital filter clock cycle, the first two digital words created after starting to sample a new input branch are usually not meaningful and are therefore usually disregarded or filtered out.

FIG. 5A represents calibration performed without merging, i.e., the samples of data from each capacitor branch are fully processed by digital filter 220 prior to averaging the results. In this example, curves 500, 502, 504 and 506 represent the digital filter response to sampling branches 212, 213, 214 and 215, respectively. In the embodiment shown in FIG. 5A, digital filter 220 settles before samples for a subsequent branch are processed by digital filter 220. For example, branch 212 is sampled from time 510 to time 512 at which time, a meaningful digital word representing branch 212 is provided to error correction section 230. Next, branch 213 is sampled from time 512 to time 514, and so on, until all four input sampling branches 212, 213, 214 and 215 are sampled. Thus, in this exemplary embodiment, it takes at least 12 digital filter clock cycles to sample all four branches and produce four digital words representing the voltage sampled by input branch 211.

In accordance with another exemplary embodiment, FIG. 5B illustrates the impulse response of a sinc$^3$ filter where the signals from the capacitors are merged within digital filter 220, thus decreasing the time it takes to calibrate the analog-to-digital converter. For example, sampling of branch 212 is conducted between the time lines denoted 520 and 522. Similarly, branch 213 is sampled during the time segment between 522 and 524, branch 214 is sampled between times 524 and 526, and branch 215 is sampled between time periods 526 and 528. After the sampling of branch 215, branch 212 can again be sampled during time segments 528 and 530, while branch 214 can again be sampled between time periods 530 and 532. Rather than requiring up to 12 digital filter cycles to sample all four branches 212–215, only six digital filter cycles are required to create four digital words which completely represent the sampled calibration voltage.As a result, merging the signals within the digital filter speeds up processing of calibration.

Figure 6:
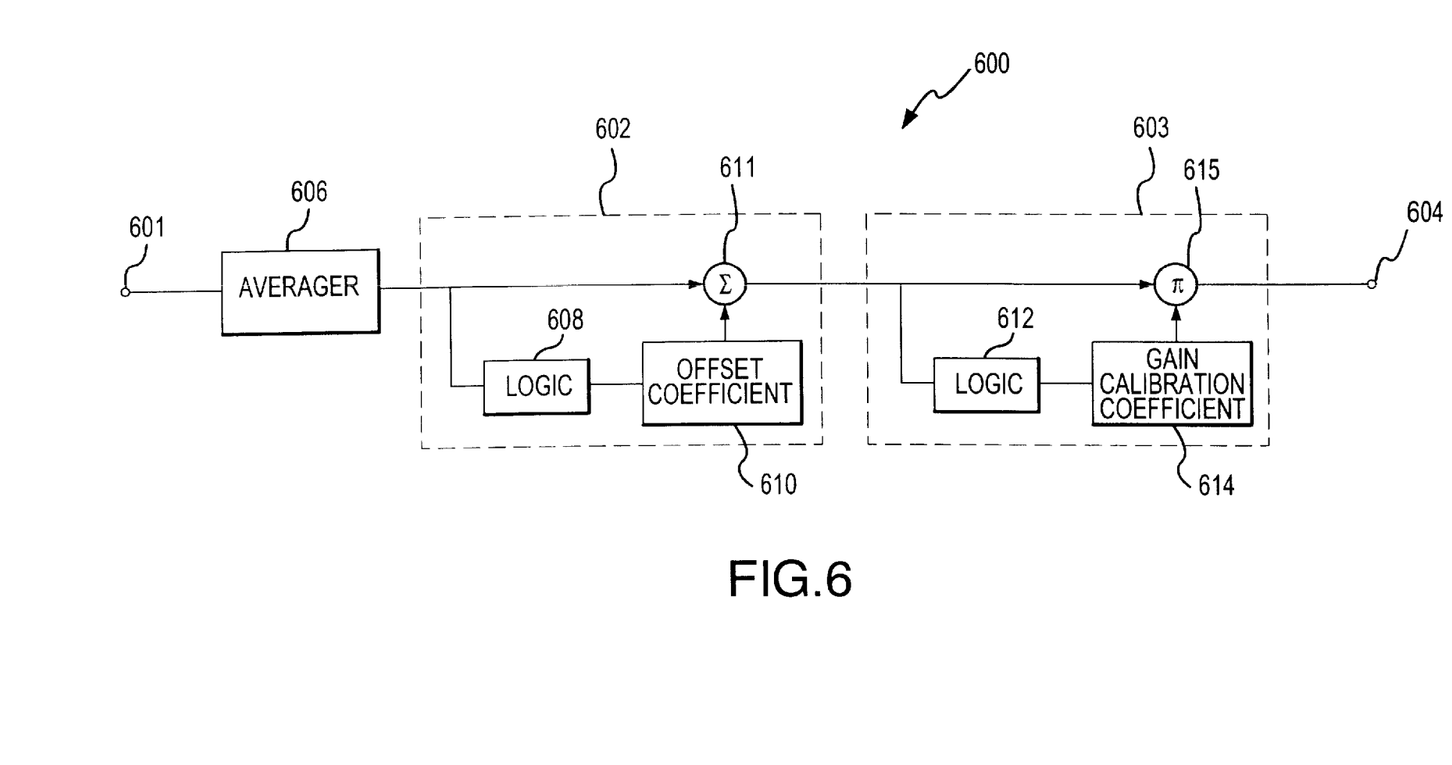
FIG. 6 illustrates an exemplary embodiment of an averaging section in accordance with the present invention.

Referring now to FIG. 6, an exemplary embodiment of an error correction section 600 is illustrated. In this exemplary embodiment, error correction section 600 suitably includes offset error correction section 602 and gain error correction 603. Offset error correction section 602 is configured to adjust the digital output to compensate for any constant errors that might exist in the analog-to-digital converter system 200. Gain error correction section 603 receives an offset adjusted signal from offset error correction section 602 and adjusts for any scaling errors that might exist in the analog-to-digital converter 200.

Offset error correction section 602 is further comprised of offset calculation logic section 608, offset coefficient storage device 610, and offset adder 611. Offset calculation logic section 608 is connected to offset coefficient storage device 610, which is suitably connected to offset adder 611. Offset adder 611 is connected to gain error correction section 603. During normal mode operation, digital filter 220 provides a digital filter signal output 225 to error correction section 230 and, more particularly, to offset adder 611. Offset adder 611 adds the digital filter signal output 225 and an offset calibration coefficient stored in offset coefficient storage device 610, and this modified signal is transmitted to a gain multiplier 615.

In accordance with an exemplary embodiment, because, for example, four digital words can be generated in digital filter signal output 25, error correction section 600 can also include an averager 606 that is inserted prior to offset calculation logic section 608 and offset coefficient storage device 610. During calibration, each of the four digital words can be suitably averaged within averager 606 prior to processing by logic section 608 and summation in offset adder 611. Thereafter, logic section 608 can compute a calibration coefficient.

In accordance with another exemplary embodiment, averager 606 can also be configured between logic section 608 and offset calibration coefficient 610. During calibration, each of the four digital words can be processed by logic section 600, which computes a calibration coefficient. Averager 606 can then accumulate the four calibration coefficients and calculates an average calibration coefficient. This average calibration coefficient can then be stored in offset coefficient storage device 610.

With continued reference to FIG. 6, gain error correction section 603 is further comprised of gain calculation logic section 612, gain coefficient storage device 614, and gain multiplier 615. Offset error correction section 602 is connected via offset adder 611 to gain multiplier 615 and gain calculation logic section 612. Gain coefficient storage device 614 is connected to gain calculation logic section 612 and gain multiplier 615. Gain multiplier 612 is connected to digital signal output 604. During normal mode operation, gain multiplier 615 multiplies the output of offset adder 611 by a gain calibration coefficient stored in gain coefficient storage device 614 and supplies the modified digital signal to digital signal output 604.

As discussed above, averager 666 can be suitably configured prior to gain error correction section 603, e.g., prior to logic section 608 and offset adder 611. Thus, during calibration, each of the four digital words can be suitably averaged within averager 606 prior to processing by gain calculation logic section 612. As a result, the sampled data received has already been suitably averaged prior to any calculation of the gain calibration coefficient.

In accordance with another exemplary embodiment, as discussed above with respect to offset error correction section 602, an averager can also be inserted between gain calculation logic section 612 and gain coefficient storage device 614. During calibration each of these four digital words can be processed by logic section 612, which computes a gain coefficient. Averager 606 can then accumulates the four gain calibration coefficients and calculates an average gain calibration coefficient. This average is then stored in the gain calibration coefficient storage device 614.

While the above exemplary embodiments can provide effective results, it should be noted that various prior art methods of offset calibration may also be suitably combined or implemented to perform the gain calibration techniques described above.

Figure 7A:
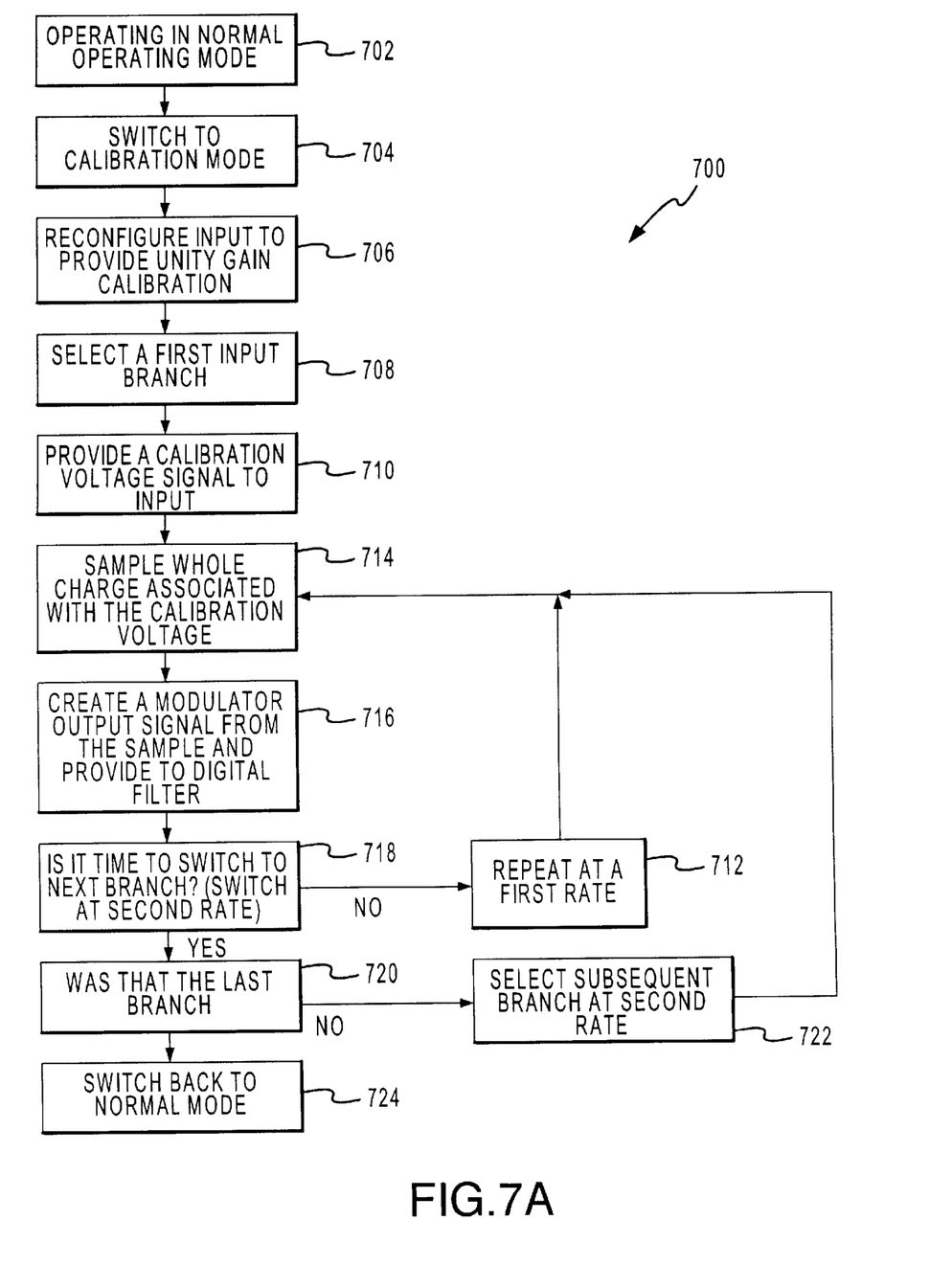
FIG. 7A illustrates an exemplary flow diagram illustrating exemplary steps, from a modulator perspective, performed in accordance with an exemplary embodiment of the present invention.

Having described an exemplary analog-to-digital converter as may be used in accordance with various embodiments of the present invention, a method for performing gain calibration 700 in an analog to digital converter in accordance with the present invention will be described with reference to FIG. 7. An analog-to-digital converter functions in a normal operating mode (step 702). During a normal operating mode, the analog to digital converter can, for example, sit idle, convert analog signals to digital signals, or perform other functions. During normal operating mode, the output of the analog to digital converter is typically adjusted to account for offset errors and gain errors; however, it is possible that the function of correcting errors during normal mode could be turned off if so desired. In normal operating mode, the analog to digital converter operates at a gain greater than one, although in alternative embodiments normal mode operation is also possible at a gain of one.

Thereafter, an input signal changes the analog to digital converter from normal operating mode to calibration mode (step 704). The initiation of the input signal may be physical in nature such as a person turning a dial, pushing a button, or flipping a switch, for example. Alternatively, the input signal may consist of an electrical, magnetic, or other appropriate signal generated, for example, by a microprocessor according to programmed logic, a timing apparatus, or other suitable device. The frequency at which calibration can or should be performed is dependent upon a multitude of conditions including risk levels, physical conditions, sensitivity of the results, and the like. In an exemplary embodiment, the calibration mode can be initiated as needed and/or upon command, such as pushing a button.

The step of switching to calibration mode 704 may further comprise the step of disconnecting the normal mode analog signal from the input section and connecting a calibration voltage. Analog signals can be disconnected and connected physically such as with a switch, or by use of semiconductors and similar devices to create an "open" or "short" circuit in an electrical path.

Next, the input section is reconfigured in step 706 to provide for unity gain calibration. In one embodiment, reconfiguring the input section is accomplished by selectively utilizing a subset (typically one) of parallel input branches. For example, if the normal mode gain is four, gain of one calibration can be established by utilizing just one of four parallel input branches at a time. Other methods for reconfiguring the input to create a gain of one can also be provided.

In an exemplary embodiment, the reconfiguration step 706 further includes isolating a first input branch from other branches in the input section in a step 708 creating the gain of one state mentioned above. Moreover, variations in the selection of input branches can be realized. For example, while step 708 in this exemplary embodiment takes place after step 706, in another embodiment, step 708 can take place as part of step 706.

A calibration voltage signal(s) can then be applied to said input branch in step 710. Although step 710 is shown in FIG. 7 as occurring after step 708 and before step 714, step 710 could occur at any time before step 714 and after step 700. Typically, the calibration voltage remains constant during the remainder of the calibration steps. However, in other embodiments it is also possible to vary the calibration signal and to connect and disconnect the calibration voltage multiple times throughout the calibration process, so long as the calibration voltage is connected at all relevant sampling times.

In step 714, the whole charge associated with the calibration voltage can be sampled onto the input sampling branch that was previously selected and configured to provide for gain of one calibration. In an exemplary embodiment, at any one time, a single input branch samples the whole charge associated with the calibration voltage.

Figure 7B:
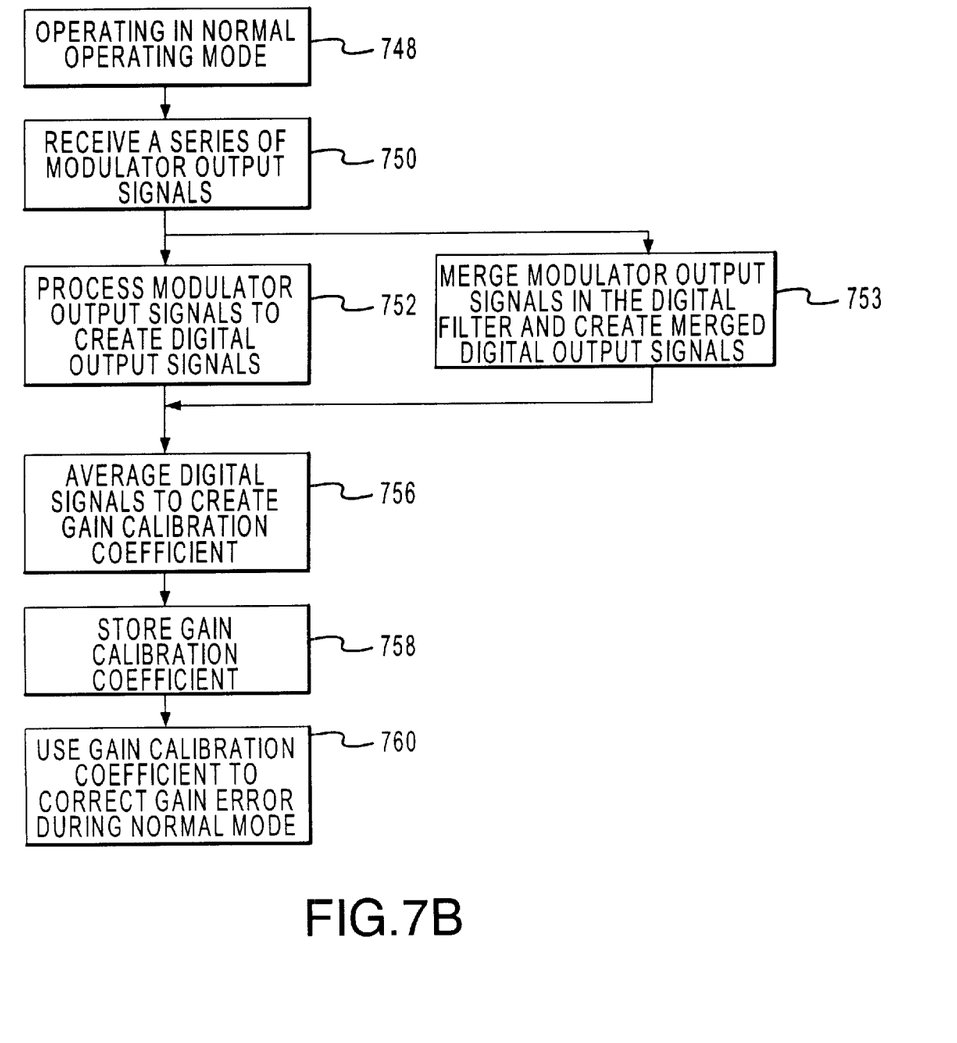
FIG. 7B illustrates an exemplary flow diagram illustrating exemplary steps, from a digital filter perspective, performed in accordance with an exemplary embodiment of the present invention.

Each sample collected from an individual branch can then be used in step 716 to create a modulator output signal proportional to the sampled whole charge. Various known methods exist for creating a modulator output signal from input section signals, and any appropriate method is within the ambit of the present invention. Each modulator output signal can then be provided to a digital filter for processing. The processing step and subsequent use of the data from the digital filter, as shown in FIG. 7B, can occur in parallel with, or suitably after, the sampling of input branch steps illustrated in FIG. 7A.

At some point after a sample has been taken, e.g. after step 714, a determination is made whether to start sampling another input branch. In accordance with an exemplary embodiment, a clock counts the duration of time that sampling has occurred on a single input branch. In accordance with another exemplary embodiment, a counter can count the number of samples taken on the current input branch. If a predetermined number of samples or time period has not yet been achieved, the logic then returns to step 714 where another sample is taken of the whole charge associated with the calibration voltage. Therefore, multiple samples are taken on a single input branch creating multiple modulator output signals.

In an exemplary embodiment, the samples can be taken and the corresponding modulator output signals can be created and/or repeated at a first rate in a step 712, which in one exemplary embodiment can be the modulator clock rate. For example, a typical modulator clock rate is 100 KHz. However, modulator clock rates vary considerably, and the first rate may comprise any suitable rate.

If it is determined in step 718 that a next input branch should be selected, a step 720 is provided for determining if the calibration process is complete, i.e., has the last input branch been sampled. If the calibration process is not yet complete, then the input sampling section is reconfigured to select a next branch in a step 722, with the input section still configured to perform calibration sampling at a gain of one. Sampling may now begin on the next input branch at step 714, with the repetitive sampling process of steps 714 through 720 being repeated for this next input branch.

The process of determining whether calibration is complete in step 720 can be accomplished in various ways. For example, a counter device can be configured to indicate when the calibration process has been completed, similar to the method described above for determining if it is time to sample a subsequent input branch. In an exemplary embodiment, the rate of selection of a subsequent input branch in step 718 and 720 comprises a second rate, such as the digital filter clock rate. This second rate may also be any other suitable rate. A typical digital filter clock rate is 1 KHz, although digital filter clock rates are known to vary widely.

The order of selection of subsequent input branches is determined in an exemplary embodiment by rotating in sequence from one input branch to the next in a physical or numerical order. However, any order of selection may be used that is consistent with the method described herein. It is desirable that every input branch used during normal mode operation be sampled at least once during calibration mode. For example, in an input section with four input branches used during normal mode operation, all four input branches may be selected in order as 1-2-3-4, 4-3-2-1, or any other suitable order.

Furthermore, it is possible to sample some input branches more than once in various embodiments of the present invention. In an exemplary embodiment of the present invention, the three cycle settling time of an appropriately selected digital filter can be advantageously exploited to merge the modulator outputs in the digital filter, as will be explained in further detail below. However, in this embodiment, for a third order digital filter, it is desirable to repeat sampling on the first two input branches sampled. In the examples above, the input branches could be selected in order 1-2-3-4-1-2, 4-3-2-14-3, or any other suitable order such that the average of the digital output words results in each branch having equal weighting.

Upon indication that the calibration process is complete, the input branches can be reconfigured back to the normal operation mode in step 724. In this step, or combined with a previous step, the calibration voltage is disconnected and the analog input voltage is connected as described above. The parallel input branches of the input section are appropriately reconfigured to provide the normal mode operating gain as before calibration had began, or in accordance with the normal mode gain considered in calibrating the analog-to-digital converter.

In accordance with an exemplary embodiment, the steps of the method described herein can be executed by a program control unit within the modulator which sends signals directing the opening and closing of switches or gates, and in general directs which components of the electrical system are to be connected at any given moment in time.

Turning now to FIG. 7B, which illustrates operation of digital filter 220, step 748 indicates that the digital filter is operating in normal mode, where it may be idle, or generating digital representations of the analog input signal. After calibration mode begins, in a step 750, the digital filter can receive a series of modulator output signals containing calibration information.

In accordance with an exemplary embodiment, the digital filter processes the modulator output signals to create digital output signals in a step 752. The digital output signal may be a single bit of information, e.g. a one or zero, or may be a digital word such as a 24 bit data word. The digital filter generates a digital bit or word every digital filter clock cycle.

A third order digital filter has a three cycle settling process. In one exemplary embodiment, data from different input branches is not merged in the digital filter. Due to the settling time, each input branch must be sampled for 3 digital filter clock cycles, and only the third digital word provides a meaningful representation of all the samples taken on a single input branch.

In accordance with another exemplary embodiment, data from different input branches can be merged in step 753 in the digital filter. Although the first two digital words may not be meaningful, the next four digital words represent an equally-weighted representation of all the samples taken on all the input branches. It is for this reason that some input branches, for example, the first two for a third order digital filter, should be sampled again as discussed above.

Referring momentarily again to FIGS. 5A and 5B, lines 510–518, and lines 520–532 represent the start/end of digital filter clock cycles. It can be observed that in FIG. 5A, digital filters wait for three digital filter clock cycles for the digital filter to settle, e.g., curves 500, 502, 504, and 506 represent the processing of calibration information from the first, second and third input branches respectively. Data from the first input branch is sampled from time 510 to 512, and the digital filter settles and provides the digital value by time 512. Using this method, it takes 12 clock cycles to process the sampled signals from all four input branches in an exemplary input branch. In contrast, the digital filter of FIG. 5B merges data within the digital filter. For example, from time 520 to 522, the first input branch data is processed by the digital filter, e.g., the first portion of curve 500, while from time 522 to 524, data from the second input branch is processed, e.g., the middle portion of curve 500 and first portion of curve 502. Using this merging process as set forth in step 753, it takes only 6 clock cycles to process the sampled signals from all four input branches.

Continuing with the calibration technique, with reference again to FIG. 7B, the digital filter provides digital words which are next averaged to create a gain calibration coefficient in a step 756. This averaging step 756 contemplates removing the non-useful digital words from consideration in the average, or alternatively selecting only the meaningful digital words for creating the average. Furthermore, this exclusion of non-meaningful data can occur at different points in the gain calibration methodology, for example, between step 752 and step 756. The gain calibration coefficient is then stored for later use in step 758. Storage can be by any known device, such as, hardware register (flip-flop) RAM or EPROM.

The digital filter is returned to normal operation mode and during normal operation, the gain calibration coefficient can be used in step 760 to correct gain errors in the output of the analog-to-digital converter. This gain error correction can be accomplished by multiplying the gain calibration coefficient by the normal mode digital filter output, thus scaling that signal up or down to a corrected value.

The present invention has been described above with reference to various exemplary embodiments. However, those skilled in the art will recognize that changes and modifications may be made to the exemplary embodiments without departing from the scope of the present invention. For example, the various processing steps, as well as the components for carrying out the processing steps, may be implemented in alternate ways depending upon the particular application or in consideration of any number of cost functions associated with the operation of the system. In addition, any type of software code configured for performing the intended functions can be utilized. These and other changes or modifications are intended to be included within the scope of the present invention, as set forth in the following claims.

What is claimed is:

1. An analog-to-digital converter configured with gain calibration to reduce gain errors, said analog-to-digital converter comprising:

a modulator configured for receiving an analog input signal comprising a positive input signal and a negative input signal during an operation mode, and a calibration reference signal during a calibration mode, said modulator comprising:

an input sampling circuit comprising a plurality of input sampling branches configured in a parallel arrangement to receive and sample said calibration reference signal, wherein each of said plurality of input sampling branches is configured to sample a whole charge of said calibration reference signal during said calibration mode;

a modulator components section configured for generating and processing a series of sampled analog signals;

a digital filter configured for receiving a series of sampled analog signals and converting said sampled analog samples into representative digital signals; and an error correction section configured for correcting any gain errors occurring during operation of said analog-to-digital converter and for providing a digital output signal, and wherein said series of sampled analog signals are averaged within said digital filter to facilitate the computation of a gain calibration coefficient.

2. The analog-to-digital converter according to claim 1, wherein said series of sampled analog signals of each of said plurality of input sampling branches are averaged after being full processing by said digital filter.

3. The analog-to-digital converter according to claim 1, wherein said series of sampled analog signals of each of said plurality of input sampling branches are merged within said digital filter prior to said series of sampled analog signals being averaged.

4. The analog-to-digital converter according to claim 1, wherein each of said plurality of input sampling branches comprises a first pair of nodes coupled to said analog input signal, and a second pair of nodes coupled to said modulator components section, and at least two input capacitors coupled between said first pair of nodes and said second pair of nodes.

5. The analog-to-digital converter according to claim 4, wherein said first pair of nodes comprises a first node coupled to the positive input signal and a second node coupled to the negative input signal, and said second pair of nodes comprises a third node and a fourth node coupled to said modulator components section, and said at least two input capacitors comprises a first input capacitor and a second input capacitor, said first input capacitor being coupled during the operation mode to said first node through a first sampling switch and to said third node through a third sampling switch, and said second input capacitor being coupled during the operation mode to said second node through a second sampling switch and to said fourth node through a fourth sampling switch.

6. The analog-to-digital converter according to claim 5, wherein said first input capacitor is coupled during a calibration mode to the calibration reference signal through a first calibration switch, and said second input capacitor is coupled during a calibration mode to the calibration reference signal through a second calibration switch.

7. The analog-to-digital converter according to claim 6, wherein said modulator further comprises a program control unit configured for opening and closing of said sampling switches and said calibration switches.

8. The analog-to-digital converter according to claim 1, wherein said sampling of a whole charge of said calibration reference signal can be conducted repetitively on one input sampling branch of said plurality of input sampling branches before proceeding to a subsequent input sampling branch to create a block of digital samples representative of samples from said one input branch.

9. The analog-to-digital converter according to claim 1, wherein said digital filter comprises a sinc-type filter.

10. The analog-to-digital converter according to claim 1, wherein said error correction section comprises:

an offset error correction section configured for adjusting said representative digital signals to compensate for constant errors existing within said analog-to-digital converter;

a gain error correction section configured for receiving an offset adjusted signal from said offset error correction section and for compensating for scaling errors existing within said analog-to-digital converter; and an averager configured for averaging said representative digital signals.

11. An analog-to-digital converter configured with gain calibration to reduce gain errors, said analog-to-digital converter comprising:

a modulator-configured for receiving an analog input signal comprising a positive input signal and a negative input signal during an operation mode, and a calibration reference signal during a calibration mode, said modulator comprising:

an input sampling circuit comprising a plurality of input sampling branches configured in a parallel arrangement to receive and sample said calibration reference signal, wherein each of said plurality of input sampling branches is configured to sample a whole charge of said calibration reference signal during said calibration mode;

a modulator components section configured for generating and processing a series of sampled analog signals;

a digital filter configured for receiving a series of sampled analog signals and converting said sampled analog samples into representative digital signals; and an error correction section configured for correcting any gain errors occurring during operation of said analog-to-digital converter and for providing a digital output signal, and wherein said series of sampled analog signals are averaged within said digital filter to facilitate the computation of a gain calibration coefficient;

wherein said error correction section comprises:

an offset error correction section configured for adjusting said representative digital signals to compensate for constant errors existing within said analog-to-digital converter;

a gain error correction section configured for receiving an offset adjusted signal from said offset error correction section and for compensating for scaling errors existing within said analog-to-digital converter; and an averager configured for averaging said representative digital signals;

wherein said offset error correction section comprises:

an offset calculation logic section coupled to said averager;

an offset adder coupled between said averager and said gain error correction section;

an offset coefficient storage device coupled between said offset calculation logic section and said offset adder; and wherein said offset adder is configured to add averaged digital signal to an offset calibration coefficient stored in said offset calibration storage device.

12. An analog-to-digital converter configured with gain calibration to reduce gain errors, said analog-to-digital converter comprising:

a modulator configured for receiving an analog input signal comprising a positive input signal and a negative input signal during an operation mode, and a calibration reference signal during a calibration mode, said modulator comprising:

an input sampling circuit comprising a plurality of input sampling branches configured in a parallel arrangement to receive and sample said calibration reference signal, wherein each of said plurality of input sampling branches is configured to sample a whole charge of said calibration reference signal during said calibration mode;

a modulator components section configured for generating and processing a series of sampled analog signals;

a digital filter configured for receiving a series of sampled analog signals and converting said sampled analog samples into representative digital signals; and an error correction section configured for correcting any gain errors occurring during operation of said analog-to-digital converter and for providing a digital output signal, and wherein said series of sampled analog signals are averaged within said digital filter to facilitate the computation of a gain calibration coefficient;

wherein said error correction section comprises:

an offset error correction section configured for adjusting said representative digital signals to compensate for constant errors existing within said analog-to-digital converter;

a gain error correction section configured for receiving an offset adjusted signal from said offset error correction section and for compensating for scaling errors existing within said analog-to-digital converter; and an averager configured for averaging said representative digital signals;

wherein said gain error correction section comprises:

a gain calculation logic section coupled to said offset error correction section;

a gain multiplier coupled between said offset error correction section and digital output of said analog-to-digital converter;

a gain coefficient storage device coupled between said gain calculation logic section and said gain multiplier; and wherein said gain multiplier is configured to multiply an output signal of said offset error correction section by a gain calibration coefficient stored in said gain calibration storage device to provide said digital output signal.

13. A modulator for facilitating gain calibration within an analog-to-digital converter during a calibration mode, said modulator comprising:

an input sampling circuit comprising a plurality of input sampling branches configured in a parallel arrangement to receive and sample a calibration reference signal, wherein each of said plurality of input sampling branches is configured to sample a whole charge of said calibration reference signal during said calibration mode;

a modulator components section configured for generating and processing a series of sampled analog signals; and wherein said sampled signals of said plurality of input sampling branches are averaged to facilitate the creation of a gain calibration coefficient for calibrating gain errors.

14. The modulator according to claim 13, wherein said sampled analog signals of each of said plurality of input sampling branches are averaged after being full processing by a digital filter.

15. The modulator according to claim 13, wherein said series of sampled signals of each of said plurality of input sampling branches are merged within a digital filter prior to said series of sampled signals being averaged.

16. The modulator according to claim 13, wherein each of said plurality of input sampling branches comprises a first pair of nodes coupled to an analog input signal, and a second pair of nodes coupled to said modulator components section, and at least two input capacitors coupled between said first pair of nodes and said second pair of nodes.

17. The modulator according to claim 16, wherein said first pair of nodes comprises a first node coupled to a positive input signal and a second node coupled to a negative input signal, and said second pair of nodes comprises a third node and a fourth node coupled to said modulator components section, and said at least two input capacitors comprises a first input capacitor and a second input capacitor, said first input capacitor being coupled during an operation mode to said first node through a first sampling switch and to said third node through a third sampling switch, and said second input capacitor being coupled during the operation mode to said second node through a second sampling switch and to said fourth node through a fourth sampling switch.

18. The modulator according to claim 17, wherein said first input capacitor is coupled during a calibration mode to the calibration reference signal through a first calibration switch, and said second input capacitor is coupled during a calibration mode to the calibration reference signal through a second calibration switch.

19. The modulator according to claim 18, wherein said modulator further comprises a program control unit configured for opening and closing of said sampling switches and said calibration switches.

20. The analog-to-digital converter according to claim 13, wherein said sampling of a whole charge of said calibration reference signal can be conducted repetitively on one input sampling branch of said plurality of input sampling branches before proceeding to a subsequent input sampling branch to create a block of digital samples representative of samples from said one input branch.

21. A method for performing gain calibration with an analog-to-digital converter, said method comprising the steps of:

switching from a normal operating mode to a calibration mode;

selecting a first input sampling branch from an input sampling section comprising a plurality of input sampling branches being configured in a parallel arrangement, wherein said first input branch is selected to reconfigure said input sampling section to provide a gain of one;

sampling a whole charge representative of a calibration voltage with said first input sampling branch during said calibration mode;

creating a modular output signal corresponding to said sampled whole charge;

repeating at a first rate said step of selecting, said step of sampling and said step of creating a modulator output, for a subsequent input sampling branch from said input sampling section;

processing modulator output signals corresponding to sampled whole charges from said input sampling section in a digital filter to provide filtered digital output signal;

averaging said filtered digital output signal to create a gain calibration coefficient stored for providing gain calibration during normal mode operation.

22. The method according to claim 21, wherein said first rate is a modulator clock rate.

23. The method according to claim 21, wherein said method further comprises the step of determining whether to sample on said subsequent input sampling branch prior to said step of repeating.

24. The method according to claim 21, wherein said method further comprises the step of selecting at a second rate said subsequent input sampling branch prior to said step of repeating.

25. The method according to claim 24, wherein said second rate is a digital filter clock rate.

26. The method according to claim 21, wherein said step of averaging comprises fully processing modulator output signals from each of said plurality of input sampling branches prior to averaging.

27. The method according to claim 21, wherein said step of averaging comprises merging said modulator output signals from each of said plurality of input sampling branches are merged within said digital filter prior to averaging.

* * * * *